United States Patent [19]

Miller

[11] Patent Number: 4,717,839
[45] Date of Patent: Jan. 5, 1988

[54] TRANSISTOR COMPARATOR CIRCUIT HAVING SPLIT COLLECTOR FEEDBACK HYSTERESIS

[75] Inventor: Ira Miller, Tempe, Ariz.

[73] Assignee: Motorola, Inc., Schaumburg, Ill.

[21] Appl. No.: 3

[22] Filed: Jan. 2, 1987

[51] Int. Cl.⁴ .................. H03K 5/24; H03K 5/153
[52] U.S. Cl. ............................ 307/359; 307/362; 307/299.3
[58] Field of Search ............ 307/299 B, 350, 358, 307/359, 362, 475, 290

[56] References Cited

U.S. PATENT DOCUMENTS

| 4,184,087 | 1/1980 | Nutz | 307/299 B |
| 4,259,601 | 3/1981 | Stein | 307/359 |
| 4,375,598 | 3/1983 | Sakai | 307/359 |

Primary Examiner—John Zazworsky
Attorney, Agent, or Firm—Michael D. Bingham

[57] ABSTRACT

A comparator circuit responsive to an applied input signal passing through a threshold voltage for providing output signal transitions which comprises circuitry for generating a controllable threshold voltage, comparing circuitry including a first multi-collector transistor which is switched on and off as the input signal passes through the threshold voltage level and which has a collector coupled to the threshold voltage circuitry for sourcing current thereto when the transistor is turned on and the threshold voltage producing circuitry being responsive to the current sourced from the transistor for increasing the magnitude of the threshold voltage, the threshold voltage being supplied to the comparing circuitry.

4 Claims, 4 Drawing Figures

TRANSISTOR COMPARATOR CIRCUIT HAVING SPLIT COLLECTOR FEEDBACK HYSTERESIS

BACKGROUND OF THE INVENTION

The present invention relates to comparator circuits and, more particularly, to a comparator circuit including a transconductance reduction input differential stage from which hysteresis is developed to provide a small amount of threshold voltage level change as the comparator switches operating states in response to an applied input signal.

The prior art is replete with comparator circuits having hysteresis for causing the threshold level to change as an applied input signal varies above and below the threshold level. In this manner noise that may be imposed onto the input signal does not cause false switching of the comparator output state as the input signal crosses the threshold level of the comparator.

Although prior art comparators work quite well they are not necessarily suited for use in high density single chip integrated circuits where size is critical. For instance, a microprocessor support chip may require such a comparator for providing logic level conversion between transistor transistor logic (TTL) and RS423 logic levels and vice versa. In order to save die area which may be necessary if the support chip is very complex it is desirable to provide such comparator function in as little area of the integrated circuit (IC) as possible. Prior art circuits may require too much die area for contemporary complex ICs.

Hence, a need exists for an improved comparator circuit having hysteresis which consumes minimal die area.

SUMMARY OF THE INVENTION

Accordingly, it is an object of the present invention to provide an improved comparator having hysteresis.

It is another object of the present invention to provide a transistor comparator circuit having split collector feedback hysteresis.

It is still another object of the present invention to provide an integrated comparator circuit having hysteresis which is suit for converting an applied digital signal of a first logic level to an output digital signal of a second logic level.

In accordance with the above and other objects there is provided a comparator circuit responsive to an applied input signal passing through a threshold voltage for providing output signal transitions which comprises circuitry for generating a controllable threshold voltage, comparing circuitry including a first multi-collector transistor which is switched on and off as the input signal passes through the threshold voltage level and which has a collector coupled to the threshold voltage circuitry for sourcing current thereto when the transistor is turned on and the threshold voltage producing circuitry being responsive to the current sourced from the transistor for increasing the magnitude of the threshold voltage, the threshold voltage being supplied to the comparing circuitry.

DETAILED DESCRIPTION OF THE PREFERRED EMBODIMENTS

Figure 1:
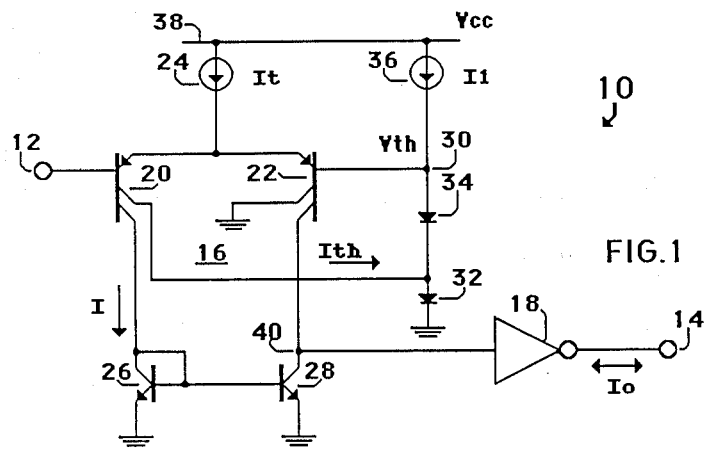
FIG. 1 is a schematic diagram illustrating a two gain stage comparator amplifier of a first embodiment of the invention.

Referring to FIG. 1 there is shown comparator amplifier 10 of one embodiment of the present invention which is suited to be fabricated as an integrated circuit. Comparator 10 comprises a two stage circuit having an input 12 and an output 14. Comparator 10 consists of transconductance reduction input stage 16 and output buffer stage 18. Input stage 16 includes a pair of differentially connected split collector PNP transistors 20 and 22 the emitters of which are commonly coupled to current source 24. A first collector of each of the transistors 20 and 22 are coupled to a differential to single ended converter or current mirror circuit comprising diode connected NPN transistor 26 and NPN transistor 28 in a known manner. As so far described, comparator 10 and transconductance reduction stage 16 are well known, for example see U.S. Pat. No. 3,801,923, which is assigned to the assignee of the present invention. Typically, the second pair of collectors of transistors 20 and 22 are returned to ground reference. However, as will be explained later, rather than dump both of the split collector currents to ground as is the current through the collector of transistor 22 the current flowing through the second collector of transistor 20 is used to provide hysteresis.

Comparator amplifier 10 viz. input stage 16 is operated as a threshold level detector by having the base of transistor 22 coupled at node 30 at which a aquiescent threshold voltage level Vth is established. This threshold voltage level is equal to approximately 2 Vbe, the diode voltage drops of diodes 32 and 34 which are series connected between node 30 and ground and supplied a bias current from current source 36 equal to I1. Current source 36 is coupled between power supply conductor 38 to which is supplied Vcc and node 30. The output of input stage 16 is taken at node 40 and is coupled to the input of output stage 18.

In operation the output at terminal 14 switches output level states whenever the applied input signal varies above and below the value of Vth as will be explained. Hence, whenever the magnitude of the input signal applied to input 12 to the base of transistor 20 is greater than Vth the transistor is turned off and no current flows from either of the split collectors thereof. Diode connected transistor will be maintained in a non-conducting state which biases transistor 28 off. In this state transistor 22 is turned on to source current to node 40. Thus, the input to output stage 18 is high which switches the output to a low level state. Output current Io is sourced from terminal 14 from the load utilization means that is coupled thereat.

As the input signal decreases from a high value to a low value the output state of threshold comparator 10 will switch as the magnitude of the input signal decreases or passes below Vth in response to transistor 20 turning on and transistor 22 being turned off. When transistor 20 turns on the currents I and Ith are sourced to diode connected transistor 26 and to the anode of diode 32 respectively. Ith, which is proportional to I, flows through diode 32 and causes the diode voltage (VbE) to increase a small amount which causes an attendant incremental rise in Vth. Hence, once the input signal decreases below the quiescent value of Vth the output state of input stage 16 cannot be switched until the magnitude of the signal increases by the incremental amount of rise in Vth. Further, as the input signal level again passes through the higher value of Vth in a positive sense transistor 20 is turned off causing the voltage level at output node 40 to once again transition. Simultaneously, Ith is inhibited and no longer flows through diode 32 which allows Vth to decrease to its quiescent value thereby introducing hysteresis on the rising slope of the input signal. Thus, hysteresis has been established by the split collector current Ith and is a function of the ratio of I1 to Ith. Moreover, by changing the ratio of Ith to I by area ratioing of the collectors of transistor 20 the value of Ith can be varied to change the amount of hysteresis.

When transistor 20 is turned on the current I flows through diode 26 which, in turn, will forward bias transistor 28. Transistor 28 will then be turned on to sink all of the available current that may be sourced to node 40. The collector voltage of transistor 28 will go low which causes the output level at output 14 to go to a high level state and the current Io to be sourced thereto. It is understood that a slew rate capacitor may be connected between the output and input of output stage 18 to control the respective rise and fall times of the output signal produced at output 14. By using transconductance reduction input stage 16 the slew rate capacitor's size may be made minimal. By current ratioing and referencing threshold comparator 10 to ground it is possible to convert a digital input signal of a first logic level applied to input 12 to a digital output signal of a second logic level at output 14. For instance, using output stage 18 illustrated in FIG. 3, a RS423 logic signal applied to input 12 is converted to transistor transistor logic (TTL) signal at output 14.

Figure 2:
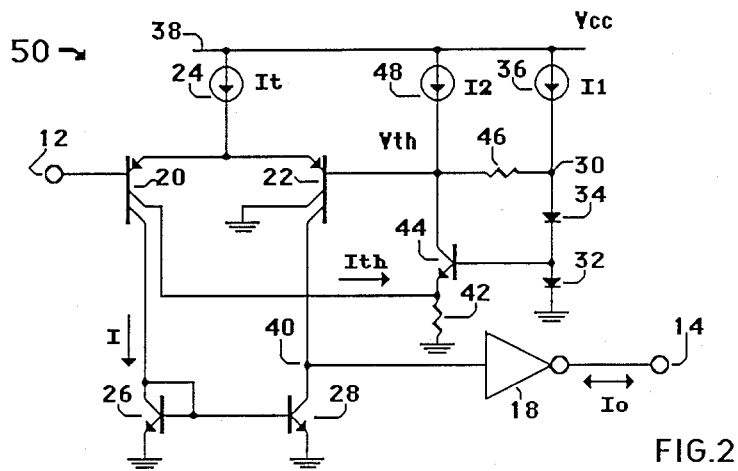
FIG. 2 is a schematic diagram illustrating a two gain stage comparator amplifier of a second embodiment of the invention.
Figure 3:
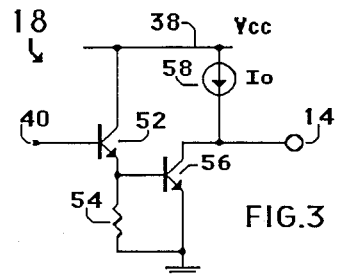
FIG. 3 is a schematic diagram illustrating the second stage of the comparator amplifiers of FIGS. 1 and 2.

Turning now to FIG. 3 output stage 18, which is suited to be used in the threshold level circuits of FIGS. 1 and 2 is described. It is understood that components in FIGS. 2, 3 and 4 which correspond to like components of FIG. 1 are designated by the same reference numbers. NPN transistor 52 has its base coupled to output node 40 and its collector-emitter conduction path coupled in series with resistor 54 between Vcc and ground. Transistor 52 is configured as an emitter follower and drives the base of NPN transistor 56. The collector-emitter conduction path of transistor 56 is coupled between output terminal 14 and ground. Current source 58 supplies a current Io and is coupled between power supply conductor 38 and output 14.

Referring to the operation of threshold comparator 10 described above, whenever transistor 28 is rendered non-conducting the current sourced to node 40 from transistor 22 supplies base current drive to transistor 52 thereby turning it on which, in turn, turns on transistor 56. Transistor 56 sinks all of the available current Io and its collector is near ground potential. The output of comparator 10 is therefore at a low level state. In response to transistor 28 being turned on it sinks all of the current that is sourced to node 40 and is operated at or near saturation which prevents transistors 52 and 56 from being turned on. In this state the collector of transistor 56 rises and the current Io is sourced to output 14.

Comparator 10 is thus switched to a high output level state.

Threshold comparator 50 illustrated in FIG. 2 operates in essentially the same manner as comparator 10 but uses an additional transistor and two resistors to establish a greater amount of hysteresis than is established by comparator 10. As shown, the split collector of transistor 20 is coupled to the interconnection of the emitter of transistor 44 and resistor 42 with the other end of resistor 42 being coupled to ground. The collector of transistor 44 is coupled to the base of transistor 22 while its base is coupled to anode of diode 32. Resistor 46 is coupled between the base of transistor 22 and node 30. Current source 48, coupled between conductor 38 and the collector of transistor 44 provides a current I2. The circuitry comprising transistor 44, resistors 42 and 46 and current source 48 provide a greater amount of hysteresis without requiring higher current ratios.

In operation, whenever transistor 20 is turned off transistor 44 is biases on to sink the current I2 whereby a nominal value of Vth is established at the base of transistor 22. However, as transistor 20 is turned on the current Ith is sourced to resistor 42 establishing a voltage drop thereacross the de-biases transistor 44 to nearly cutoff. In this state the current I2 will flow through resistor 46 into diodes 34 and 32. Threshold voltage, Vth, will increase due to the additional current flow through the diodes and the IR drop across resistor 46. Hysteresis is a function of resistors 42 and 46 as well as the current ratioing. It is understood that the collectors of PNP transistors 20 and 22 can be split in a variety of configurations and the emitters of transistor 44 and diode 32 (which may be realized of a collector-base shorted transistor) may be area ratioed accordingly to accommodate various hysteresis levels with various current values.

Figure 4:
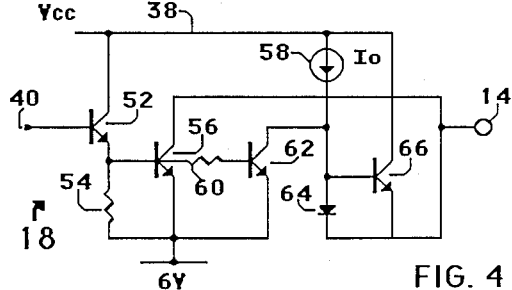
FIG. 4 is a schematic diagram illustrating an alternate embodiment of the second stage of the comparator amplifier of FIGS. 1 and 2.

Referring to FIG. 4 there is illustrated another embodiment of output stage 18 that may be used in conjunction with threshold comparator 10 of FIG. 1 to provide conversion between TTL and RS423 logic levels. In the subject embodiment the emitters of transistors 26 and 28 are now returned to a source of negative six volts instead of ground. As shown, transistor 52 which is configured as an emitter follower as previously described drives transistor 56 and, via resistor 60 drives the base of transistors 62 the emitters of which are returned to −6 volts. The collector of transistor 56 is coupled to output terminal 14 while the collector of transistor 62 is coupled to the anode of diode 64 (which may be realized by a diode connected transistor). The anode of diode 64 is coupled both to current source 58 and the base of transistor 66 while the cathode and emitter of the same are coupled to output 14. The collector of transistor 66 is coupled to conductor 38.

In accordance with the description of the operation of comparator 10 above, when transistor 28 is in a non-conducting condition, current sourced to node 40 from transistor 22 will bias transistor 52 on. This will cause both transistors 56 and 62 to be turned on as base current drive is supplied from transistors 52. Transistor 62 will sink all of the currnet Io thereby biasing off diode 64 and transistor 66. Simultaneously, transistor 56 will sink current from the load coupled to output 14 thereby establishing a negative voltage level thereat. When transistors 28 is turned on and base drive is no longer supplied to transistor 52 it turns off also turning off transistors 56 and 62. The current Io is then supplied to diode connected transistor 64. This current is then mirrored accordingly through transistor 66 and is sourced along with the current flowing through diode 64 to output 14. In this state the voltage level at the output terminal goes positive. By appropriate ratioing the voltage at output 14 can be switched between +/−3.6 volts which corresponds to RS423 logic levels. Current ratioing, for example, may include emitter area ratioing of transistor 66 and diode connected transistor 64 as is understood.

Hence, what has been described above is a novel threshold comparator circuit having hysteresis generated using a transconductance split collector reduction input stage. The comparator is suited for providing conversion of an input signal of a first logic level to an output signal of a second logic level.

I claim:

1. A threshold detector circuit for generating output signal transition in response to an applied input signal passing through a threshold voltage level, comprising:

circuit means for providing a controllable threshold voltage at an output:

comparing means for providing signal transitions at an output thereof, said comparing means having a first input to which the input signal is applied, a second input coupled to said output of said circuit means and including a first multi-collector transistor having a first collector coupled to said circuit means for sourcing a current when said first transistor is rendered conductive;

said circuit means being responsive to said current from said first transistor for varying the magnitude of said controllable threshold voltage;

said comparing means including;

a second multi-collector transistor having a first collector coupled to a first supply conductor to which is supplied ground reference potential, a base coupled to said second input of said comparing means, an emitter and at least a second collector;

said first transistor having a base coupled to said first input of said comparing means, an emitter coupled to said emitter of said second transistor and at least a second collector;

a current mirror circuit coupled between said second collectors of said first and second transistors and said output of said comparing means; and a current source for providing current to said emitters of said first and second transistors.

2. The circuit of claim 2 wherein said circuit means includes:

a current source for supplying a current at an output thereof, said output being coupled to said second input of said comparing means; and a plurality of diode means coupled in series between said output of said current source of said circuit means and said first supply conductor for passing said curent supplied therefrom to produce said controllable threshold voltage, said first collector of said first transistor being coupled between the interconnection of first and second ones of said plurality of diode means.

3. The circuit of claim 3 including output circuit means coupled between said output of said comparing means and an output of the threshold detector at which the output signal is generated.

4. A hysteresis generating circuit for use in conjunction with a comparator circuit having a first input to which is supplied an input signal, second input and an output at which output signal transitions are generated as the input signal passes through a threshold voltage level, the improvement comprising:

the comparator circuit including a pair of differentially coupled multi-collector transistors the bases of which are coupled respectively to the first and second inputs of the comparator circuit, the emitters of which are coupled to a current source, a differential to single ended converter circuit coupled between first collectors of said pair of transistors and the output of said comparator circuit, a second collector of a first transistor of said pair being coupled to ground reference;

circuit means for producing a controllable threshold voltage at an output thereof, said circuit means including at least a pair of diode means coupled in series to a current source for sinking current supplied therefrom; and means for coupling a second collector of a second one of said pair of transistors to the interconnection between said pair of diode means.

* * * * *